(12) United States Patent
Wang et al.

(10) Patent No.: US 9,362,332 B1
(45) Date of Patent: Jun. 7, 2016

(54) METHOD FOR SEMICONDUCTOR SELECTIVE ETCHING AND BSI IMAGE SENSOR

(71) Applicant: Semiconductor Manufacturing International (Shanghai) Corporation, Shanghai (CN)

(72) Inventors: Simon Wang, Shanghai (CN); Phil Wu, Shanghai (CN); Victor Luo, Shanghai (CN); Silver Xi, Shanghai (CN); Jason Chang, Shanghai (CN); Kevin Shi, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/542,525

(22) Filed: Nov. 14, 2014

(51) Int. Cl.
*H01L 21/306* (2006.01)
*H01L 27/146* (2006.01)
*H01L 21/02* (2006.01)

(52) U.S. Cl.
CPC .... *H01L 27/14687* (2013.01); *H01L 21/02532* (2013.01); *H01L 21/30604* (2013.01); *H01L 27/1464* (2013.01); *H01L 27/14685* (2013.01)

(58) Field of Classification Search
CPC .................. H01L 21/02367; H01L 21/02373; H01L 21/02518
See application file for complete search history.

(56) References Cited

U.S. PATENT DOCUMENTS

2008/0142846 A1* 6/2008 Kim .................... H01L 21/0237
257/200

* cited by examiner

*Primary Examiner* — Cheung Lee
(74) *Attorney, Agent, or Firm* — Kilpatrick Townsend and Stockton LLP

(57) ABSTRACT

A method of selectively etching a semiconductor device and manufacturing a BSI image sensor device includes etching a doped silicon substrate with an HNA solution for a predetermined time duration to obtain an etching solution having a concentration $C_1$ of nitrite ions, etching the semiconductor device using the obtained etching solution. Etching the semiconductor device requires an initial concentration $C_0$ of nitride ions that is lower than $C_1$. The HNA solution comprises a hydrofluoric acid (HF), a nitric acid ($HNO_3$), and a acetic acid ($CH_3COOH$). The BSI image sensor device will have a uniform thickness when etched using the thus obtained etching solution.

20 Claims, 3 Drawing Sheets

METHOD FOR SEMICONDUCTOR SELECTIVE ETCHING AND BSI IMAGE SENSOR

BACKGROUND OF THE INVENTION

The present invention relates to wet etching of integrated circuits, and more particularly to a selective etching process in the manufacturing of BSI image sensors.

With the development and progress of information technology, design and manufacturing of semiconductor integrated circuits has become a sign of the national strength and innovation ability of enterprises. The manufacturing process of an integrated circuit includes wafer fabrication, polishing, oxidation, lithography, epitaxial growth, etching, packaging, and other processes. Chemical etching or chemical mechanical polishing is one of the key technological processes for removing a portion of an integrated circuit. Chemical etching includes wet etching and dry etching. The difference between the wet and dry etching is that wet etching uses a solution or solvent whereas dry etching uses a chemical etchant gas for etching.

A conventional CMOS image sensor includes a semiconductor substrate having a plurality of pixel cells arranged in a matrix. A shallow trench isolation (STI) structure is disposed between two adjacent pixel cells. FIG. 1 is a simplified cross-sectional view of a conventional backside illuminated (BSI) CMOS image sensor. The BSI CMOS image sensor includes a semiconductor substrate 100 and a plurality of pixel unit regions 103. Referring to FIG. 1, two pixel units are used as an example for illustrative purposes. Shallow trench isolation structures 106 are disposed between any two adjacent pixel units. A pixel unit region 103 includes a photodiode region 104 and a transistor region 105. Photodiode region 104 is used to form a photodiode, and transistor region 105 is used to form transistors. The photodiode converts irradiated light into an electrical signal that is amplified by the transistors. Semiconductor substrate 100 includes a first surface 101 and a second surface 102 that is opposite to the first surface 101. Light enters from the second surface 102 into pixel unit region 103.

However, since the semiconductor substrate 100 generally has a thickness between 600 um and 1000 um, visible light that enters into the semiconductor substrate from second surface 102 may be absorbed and does not reach pixel unit region 103. Therefore, semiconductor substrate 100 is submitted to a polishing process to reduce its thickness to about 5 um and to an etching process to further reduce its thickness to about 2 um. Conventional polishing processes include performing an ion implantation into the first surface 101 to form a doped layer, and by controlling the doping concentration, doping energy and dose such that the doping concentration in the neighborhood of the first surface 101 is as low as possible. Thereafter, semiconductor substrate 100 is submitted to a polishing process on second surface 102 using the doped layer as a barrier layer until the thickness is about 5 um. Thereafter, an etching process is performed to semiconductor substrate 100 to reduce its thickness to about 2 um. Then, a filter and micro-lenses are formed on the surface of the semiconductor substrate 100. However, BSI CMOS image sensor devices manufactured with conventional processes tend to have relatively low yield and poor performance. The reasons can be, for example, low quantum efficiency, unclear image, non-uniformity of light, uneven thickness of the semiconductor substrate due to instability of etching rate, thereby affecting the optical path of light entering the CMOS image sensor.

BRIEF SUMMARY OF THE INVENTION

Embodiments of the present invention provide a method of selectively etching having a stable appropriate etching rate for mass production of semiconductor substrates having a uniform thickness.

In an embodiment, a method of selectively etching a semiconductor device and manufacturing a BSI image sensor device includes preparing an etching solution which comprises etching a doped silicon substrate with an HNA (HF—$HNO_3$—$CH_3NOOH$) solution for a predetermined time duration to obtain the etching solution having a concentration $C_1$ of nitrite ions, and etching the semiconductor device using the obtained etching solution. Etching the semiconductor device requires an initial concentration $C_0$ of nitrite ions that is lower than the concentration $C_1$ of the etching solution. The HNA solution comprises a hydrofluoric acid (HF), a nitric acid ($HNO_3$), and an acetic acid ($CH_3COOH$). The BSI image sensor device will have a uniform thickness when etched using the thus obtained etching solution.

In another embodiment, a method of manufacturing a BSI image sensor device includes providing a substrate having a first side and a second side that is opposite of the first side (S101), forming an epitaxial layer on the first side of the substrate, the epitaxial layer has a resistivity R1 greater than the resistivity R2 of the substrate (S102); selectively etching the second side to expose a lower surface of the epitaxial layer using an etching solution described above (S103), and sequentially forming an optical filter on the etched second side and micro-lenses on the optical filter (S104).

The following description, together with the accompanying drawings, will provide a better understanding of the nature and advantages of the claimed invention.

DETAILED DESCRIPTION OF THE INVENTION

Figure 1:
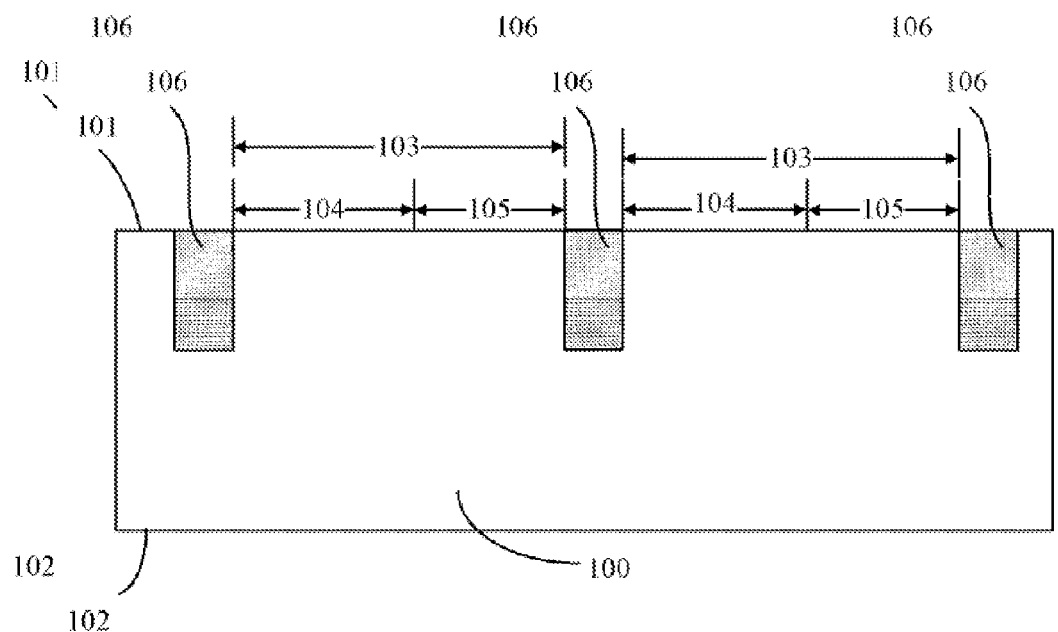
FIG. 1 is a simplified cross-sectional view of a CMOS image sensor to explain some terms used in the present description.

It should be understood that the drawings are not drawn to scale, and similar reference numbers are used for representing similar elements. As used herein, the terms "example embodiment," "exemplary embodiment," and "present embodiment" do not necessarily refer to a single embodiment, although it may, and various example embodiments may be readily combined and interchanged, without departing from the scope or spirit of the present invention. Furthermore, the terminology as used herein is for the purpose of describing example embodiments only and is not intended to be a limitation of the invention.

The terms "wafer", "substrate" and "silicon" are to be understood as including silicon-on-insulator (SOI) or silicon-on-sapphire (SOS) technology, doped and undoped semiconductors, epitaxial layers of silicon supported by a base semiconductor foundation, and other semiconductor structures.

Furthermore, when reference is made to a "wafer", "silicon", "silicon substrate" or "substrate" in the following description, previous processes may have been utilized to form regions or junctions in the base semiconductor structure or foundation. In addition, the semiconductor need not be silicon-based, but could be based on silicon-germanium, germanium, or gallium arsenide.

The term "etching selectivity" is referred to as the ratio of the etching rate on the layer to be etched to the etching rate of a nearly layer. Etching rate and etch rate are used alternatively. The term "resistivity" is defined as a measure of how strongly a material opposes the flow of electric current.

The term of "a semiconductor device to be etched" is referred to as a semiconductor device having different resistivity components and being ready for a selective etching. The term "hydrofluoric acid" is referred to as an aqueous solution formed of HF gas. The concentration range of the hydrofluoric acid may be within the range of conventional use. In embodiments of the present invention, the weight percentage of the concentration of the hydrofluoric acid is in the range between 30% and 50%.

The term "nitric acid" is referred to as a mixed solution of pure nitric acid and water. The concentration range of the nitric acid may be within the range of conventional use. In embodiments of the present invention, the weight percentage of the concentration of the nitric acid is in the range between 50% and 70%.

The term "acetic acid", also known as glacial acetic acid, is referred to as a mixed solution of pure acetic acid and water. The concentration range of the acetic acid may be within the range of conventional use. In embodiments of the present invention, the mass percentage of the concentration of the acetic acid is in the range between 80% and 100%.

As described above, semiconductor substrates may have problems of uneven thickness using conventional etching and polishing processes. The present inventors discovered that the use of an HNA etching solution having an initial nitride ion concentration required for selective etching a semiconductor substrate can be improved in its etching characteristics if a pretreatment is performed on the HNA etching solution so that the nitrite ion concentration of the pretreated etching solution is higher than or equal to the initial nitrite ion concentration. The present inventors found that using this pretreatment to prepare the etching solution will produce an even thickness of the semiconductor substrate that has improved performance.

The following relations illustrate the etch reaction occurred when combining an HNA solution with a doped silicon:

$$2HNO_3 + 3R = 3RO + 2NO + H_2O \tag{1}$$

$$H^+NO_3^- + 2NO + H_2O = 3HNO_2 \tag{2}$$

$$2HNO_2 + R = RO + 2NO + H_2O \tag{3}$$

$$RO + 6HF = RF_6^{2-} + 2H_2O + 2H^+ \tag{4}$$

where R is a reducing agent.

From the above equations, the reaction of the nitric acid present in the HNA solution with the doped silicon generates nitride ions (Equations (1) and (2)). The generated nitride ions are oxidized with the doped silicon to generate a doped silicon oxide (oxidation reaction in equation (3)). The reaction of the doped silicon oxide with a hydrofluoric acid generates a soluble substance for etching a semiconductor device (equation (4)). The acetic acid in the HNA solution acts as an inhibitor. When the resistivity of a semiconductor device to be etched is increased, the inhibition of the acetic acid is more significant.

According to embodiments of the present invention, a selective etching method includes etching a doped silicon using an HNA solution (HF—$HNO_3$—$CH_3COOH$), the concentration of nitrite ions is defined as $C_1$ after a predetermined time period. Thereafter, the semiconductor device is etched using this concentration $C_1$ of nitrite ions, the initial concentration of nitrite ions required for selective etching the semiconductor device is defined as $C_0$, the concentration $C_1$ is higher than or equal to $C_0$, and the HNA solution is formed as a mixed solution of hydrofluoric acid, nitric acid, and acetic acid. Because the concentration $C_1$ is higher than or equal to $C_0$, an etching reaction will occur when the etching solution is in direct contact with the etching solution, there is no waiting time for the reaction of the semiconductor device with the HNA solution to gradually generate nitrite ions. Equation (3) shows the direct chemical reaction. In other words, the concentration of nitrite ions does not need to accumulate from zero to $C_0$. In addition, due to the presence of nitrite ions, the generated nitrite ions according to equation (2) are relatively few, so that the concentration of the nitrite ions in the etching solution will not increase during the etching process, and therefore, the etching rate is relatively stable, and the etched semiconductor device has a more uniform thickness to avoid the uneven thickness problem of conventional etching processes. The initial concentration $C_0$ of nitrite ions may vary according to conditions of the HNA solution and the doped concentration of the to be etched substrate. The initial concentration $C_0$ can be either predetermined based on an actual requirement or based on pre-test data.

Figure 2:
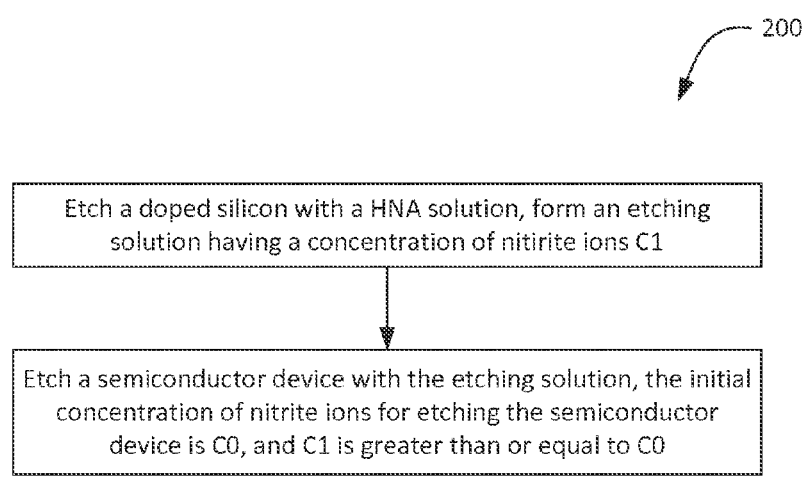
FIG. 2 is a simplified flow chart of a method of selective etching silicon according to an embodiment of the present invention.

FIG. 2 is a simplified flow chart of a method 200 of selective etching according to an embodiment of the present invention. As shown in FIG. 2, method 200 includes etching a doped silicon using an HNA solution. In a specific embodiment, the doped silicon has a resistivity less than $10^{-1}$ Ω·cm. The concentration of generated nitrite ions in the etching solution is $C_1$ and the initial concentration of nitrite ions in the required etching solution for the semiconductor device is $C_0$, the concentration $C_1$ is greater (higher) than or equal to $C_0$. In an embodiment, the concentration $C_1$ is greater (higher) than or equal to 2 times the concentration $C_0$, and more preferably, the concentration $C_1$ is greater (higher) than or equal to 5 times the concentration $C_0$. In an embodiment, the concentration of nitrite ions reaches a saturation state. The term "saturation", "saturation state", or "concentration saturation" refers to the concentration of nitrite ions in the HNA solution that reaches a maximum value under normal pressure and room temperature conditions.

Thereafter, a selective etching will be performed on the semiconductor device using the etching solution obtained using the above-described processes. Since the concentration $C_1$ is greater (higher) than or equal to the initial concentration $C_0$ that is required for etching the semiconductor device, the nitrite ions can have a direct etch effect when the semiconductor device to be etched is in contact with the etching solution, and a high etching rate can be achieved at the beginning of etching. Moreover, the large the difference between the concentrations $C_0$ and $C_1$, the more intense is the deceleration of the reaction of equation (2), the etching process generates fewer nitrite ions, or almost no nitrite ions. Moreover, when the concentration $C_1$ is higher than or equal to 5 times the concentration $C_0$, or the concentration is in the saturation state, the concentration of nitrite ions is far more higher than the required initial concentration $C_0$ required for etching the semiconductor device, so that the nitrite ions consumed in the etching process do not affect or minimally affect the etching rate of the selective etching.

Therefore, one of the contributions of the present invention is to provide an etching solution having a relatively high concentration of nitrite ions obtained by pretreating the HNA solution, and using this etching solution with the relatively high concentration to achieve the uniformity of the etch rate. Based on this reaction principle, the term "predetermined reaction time of the HNA solution with the doped silicon" is referred to as the time for an adequate response of the HNA solution reacting on the doped silicon until a concentration of nitrite ions in the HNA solution reaches the concentration $C_1$. The term "predetermined reaction time" is related to the resistivity of the doped silicon. The term "predetermined reaction time" is also related to the ratio of the hydrofluoric acid, nitric acid, and acetic acid in the HNA solution. Those of skill in the art can obtain the specific value of the predetermined reaction time depending on the specific conditions of the doped silicon and the HNA solution. In an actual production, in order to make the nitrite ions in the HNA solution to reach the saturation state, the predetermined reaction time can be set to the longest reaction time required for reaching the saturation state. In an example embodiment, the predetermined reaction time may be about 55 to 60 minutes, preferably about 60 minutes. Likewise, the "initial concentration $C_0$ of nitrite ions required for selectively etching the semiconductor device" is related to the resistivity of the semiconductor device. The "initial concentration $C_0$ of nitrite ions required for selectively etching the semiconductor device" is also related to the ratio of the hydrofluoric acid, nitric acid, and acetic acid in the HNA solution. One of skill in the art may obtain the initial concentration $C_0$ of nitrite ions through testing based on conditions of the resistivity of the semiconductor device and the HNA solution.

In a specific embodiment, the concentration of nitrite ions in the HNA solution can be obtained using convention testing methods, such as nitrite ions test strips, nitrite ions brown ring experiments (tests), the Griess process, or nitrite ion kit. Any other nitrite ion detection methods known in the art can be used and fall within the scope of the present invention. The etch rate can be used to determine whether or not the etching solution is in the saturation state. Specifically, when the etch rate reaches a steady state, the nitrite ions in the HNA solution can be considered to reach saturation.

In embodiments of the present invention, the HNA solution includes a hydrofluoric acid (HF), a nitric acid ($HNO_3$), and an acetic acid ($CH_3COOH$) mixed in a predetermined percentage. In a specific embodiment, the HNA solution has a volume ratio of $HF:HNO_3:CH_3COOH$ in the range of 1-5:1-5:2-15, preferably the volume ratio of $HF:HNO_3:CH_3COOH$ in the HNA solution is 1:3:8. The mass concentration percentage of the hydrofluoric acid (HF) is in the range between 30% and 50%, the mass concentration percentage of the nitric acid ($HNO_3$) is in the range between 50% and 70%, and the mass concentration percentage of the acetic acid ($CH_3COOH$) is in the range between 80% and 100%.

In embodiments of the present invention, the resistivity of the doped silicon is preferably less than $10^{-1}$ $\Omega\cdot cm$ so that the HNA solution can react more easily with the doped silicon with resistivity less than $10^{-1}$ $\Omega\cdot cm$ to generate nitrite ions. If the resistivity of the doped silicon is greater or equal to $10^{-1}$ $\Omega\cdot cm$, than the HNA solution will not easily react with the doped silicon. In a preferred embodiment, the doped silicon has a resistivity less than $10^{-2}$ $\Omega\cdot cm$, and more preferably the resistivity of the doped silicon is in the range between $10^{-3}$ $\Omega\cdot cm$ and $10^{-2}$ $\Omega\cdot cm$. When the resistivity of the doped silicon is in the preferred range between $10^{-3}$ $\Omega\cdot cm$ and $10^{-2}$ $\Omega\cdot cm$, the nitrite ions in the HNA solution can quickly reach saturation, which is particularly advantageous when used in industrial applications or operations. The doped silicon can be formed by implanting arsenic, antimony, phosphorous, boron, and other elements into the silicon. Any conventional ion implantation processes can be used and will not be described herein for the reason of brevity.

An N-type silicon or a P-type silicon may be used for the doped silicon. In a preferred embodiment, a P-type silicon is used. For the same resistivity, the etch rate of a P-type silicon is greater than the N-type silicon. In order to facilitate industrial applications, P-type silicon is preferred over N-type silicon. In some embodiments, the dopant concentration of a N-type silicon is larger than $1\times10^{18}$ atoms/cm$^3$, and the resistivity is <0.01 $\Omega\cdot cm$, the dopant concentration of a P-type silicon is higher than $1\times10^{18}$ atoms/cm$^3$, and the resistivity is in the range of 0.006 to 0.01 $\Omega\cdot cm$.

Processes for etching the doped silicon with the HNA solution and selectively etching the semiconductor device may include: directly spraying the etching solution onto a surface of the doped silicon or the semiconductor device, evenly distributing the etching solution on the surface by rotating (spinning) the doped silicon or the semiconductor device, and etching the surface at a predetermined temperature. In a specific embodiment, an etching liquid is sprayed onto the wafer to be etched and through low rotation speed (<500 rpm) so that the etching liquid is evenly distributed on the surface of the wafer, and a selective etching is performed at a temperature of about 25° C.±5° C. Of course, other etching processes may be used. For example, a doped silicon can be directly immersed in the HNA solution. One of skilled in the art may select a suitable etching process according to specific production requirements.

In addition to the above-described processes, embodiments of the present invention may also include cleaning the etched doped silicon or semiconductor device (wafer), back-grinding, flipping the silicon or semiconductor device, chemical mechanical polishing, and other processes, which are performed by conventional techniques and will not be described herein.

Figure 3:
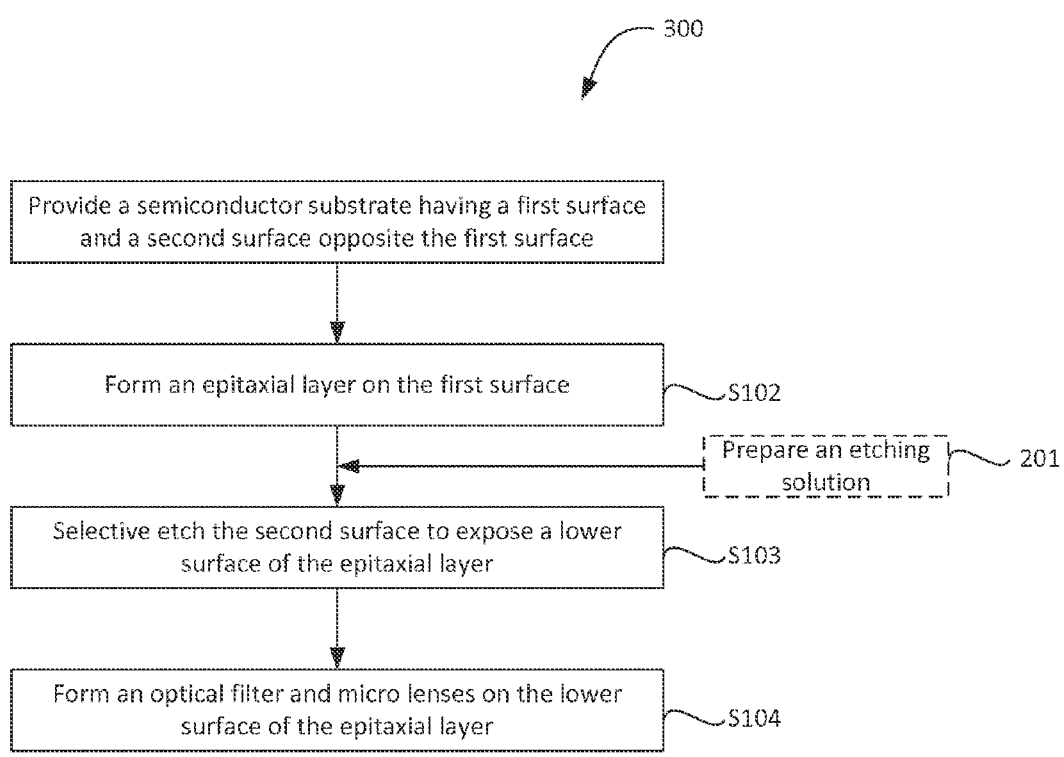
FIG. 3 is a simplified flow chart of a method of manufacturing a BSI image sensor according to an embodiment of the present invention.

FIG. 3 a flow chart of a method 300 of manufacturing a BSI image sensor device according to an embodiment of the present invention. Method 300 includes:

S101: providing a substrate (wafer) having a first side (surface) and a second side (surface) opposite of the first side (surface). The substrate has a resistivity R2 lower than $10^{-1}$ $\Omega\cdot cm$. In a preferred embodiment, resistivity R2 is in the range between $10^{-2}$ $\Omega\cdot cm$ and $10^{-3}$ $\Omega\cdot cm$. The substrate having a resistivity R2 lower than $10^{-1}$ $\Omega\cdot cm$ can be formed by implanting dopant elements into the substrate, the dopant elements can be arsenic, antimony, phosphorous, boron, and other elements.

S102: forming an epitaxial layer on the first surface. The epitaxial layer has a resistivity R1 higher than $10^{-1}$ $\Omega\cdot cm$. In a preferred embodiment, resistivity R1 is higher than or equal to 10 times the resistivity R1, and more preferably higher than or equal to 100 times the resistivity R1. The greater the difference between resistivity R1 and resistivity R2, the better is the selective etching. The epitaxial layer is used for forming a filter and micro-lenses on its surface in subsequent processes. The epitaxial layer may include any materials compatible with the semiconductor process, but in order to implement the subsequent selective etching process, the resistivity of the epitaxial layer is preferably higher than $10^{-1}$ $\Omega\cdot cm$. For example, forming the epitaxial layer may include a silicon-containing gas $SiH_4$ or $Si_2H_6$, the flow rate of the silicon-containing gas is in the range between 10 sccm and 1000 sccm, a temperature in the range between 600° C. and 1100° C., and a pressure in the range between 1 Torr and 500 Torr. The epitaxial layer may also be doped with an impurity. The epitaxial layer may be doped using an in-situ doping or an ion implantation process. The epitaxial layer has a thickness in the range between 1 um and 20 um, preferably between 1 um and 7 um, and more preferably about 3 um. A too thin epitaxial layer may result in an excessive red light component through the epitaxial layer, resulting in a reduced amount of the red light component absorbed in the sensing area disposed within the epitaxial layer, leading to color distortion. A too thick epitaxial layer may result in a too long propagation path for incident light traversing through the subsequently formed micro-lenses in the epitaxial layer, leading to excessive loss of light, especially blue light components that can only be absorbed in a shallow region.

After completing the above-described process steps, method 300 may include forming a light sensing region in the epitaxial layer, forming a pixel region, an interconnection structure, a passivation layer on the epitaxial layer. The light sensing region may include a photodiode that converts an optical signal into an electrical signal. The pixel region is to amplify the electrical signal of the photodiode and output the amplified electrical signal for further processing. Isolation structures such as shallow trench isolation structures are formed between adjacent pixels. The interconnection structure may include an interlayer dielectric layer structure and a metal wiring structure embedded in the interlayer dielectric layer structure. The metal wiring structure may include 2 to 5 metal wiring layers made of aluminum or copper that are isolated from each other by the interposed interlayer dielectric layers. The interconnection structure is to provide electrical connections between the BSI image sensors and external processing circuits. The passivation layer is a protection layer formed on the interconnection structure and can include silicon oxide, silicon nitride, or a combination of silicon oxide and silicon nitride.

S103: selectively etching the second surface of the substrate using an etching solution to expose the lower surface of the epitaxial layer. Since the resistivity R1 of the epitaxial layer is greater than the resistivity R2 of the substrate, the etching process stops at the surface of the epitaxial layer. The process of generating the etching solution and the selective etching have been described in detail above with reference to FIG. 2. The process of preparing the etching solution can be a parallel process with S101 and S102 and is presented in a dashed line box 200 in FIG. 3.

S104: sequentially forming an optical filter and micro-lenses on the lower surface of the epitaxial layer.

The optical filter may include a matrix of blue, green, and red filter units. For example, blue light only passes through the blue filter units, green light only passes through the green filter units, and red light only passes through the red filter units. The optical filter may have a thickness in the range between 3,000 and 10,000 angstroms.

The surface of the micro-lenses close to the epitaxial layer is flat, and the surface facing away from the epitaxial layer is convex. Each of the micro-lenses is aligned with one of the sensing area. The micro-lenses may be formed of an oxide material or an organic material. The materials used for the micro-lenses have a refractive index in the range between 1.4 and 1.6. The micro-lenses may be formed using the following process steps: depositing a material layer suitable for the micro-lenses on the surface of the epitaxial layer, patterning the material layer through lithography processes (exposing and developing), thereafter, forming the convex micro-lenses on the surface facing away from the epitaxial layer through a reflow process and controlling the radius of curvature of the convex surface through the control of the reflow temperature.

Figure 4A:
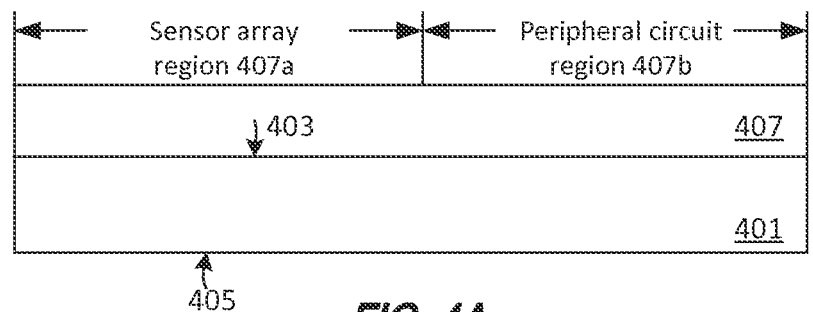
FIGS. 4A-4C are cross-sectional views illustrating a sequence of process steps according to an embodiment of the present invention.
Figure 4B:
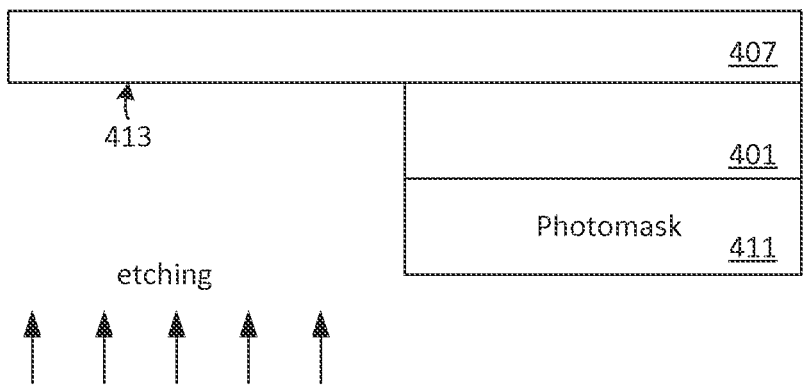
Figure 4C:
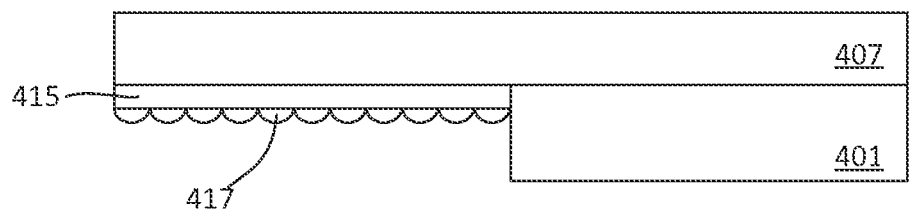

FIGS. 4A-4C are cross-sectional views illustrating a sequence of process steps according to an embodiment of the present invention. Referring to FIG. 4A, a substrate 401 is shown having a first surface (top side) 403 and a second surface (bottom side) 405. Substrate 401 may be of a semiconductor material such as silicon. In an embodiment, the silicon is a doped silicon substrate having a resistivity less than $10^{-1}$ $\Omega \cdot cm$. An epitaxial layer 407 is formed on the first surface. Epitaxial layer 407 may be processed to include a sensor array region 407a and a peripheral circuit region 407b. Sensor array region 407a may include many thousands of photodiodes (not shown), and peripheral circuit region 407b may include many thousands of transistors (not shown).

A portion of substrate 401 in the peripheral region is covered by a photoresist layer 411. Photoresist layer 411 may be formed and patterned by photolithography. A wet etching is used to remove the exposed portion of substrate 401. The wet etching uses an etching solution that can be prepared according to the description in FIG. 2. In other words, the etching solution has a nitrite ion concentration that is higher than an initial nitrite concentration required for etching the substrate. The etching process stops when a bottom surface 413 of epitaxial layer 407 is exposed, as shown in FIG. 4B. The photoresist layer is then removed, and the substrate is cleaned. An optical filter 415 may be formed over the exposed surface 413 of epitaxial layer 407, and micro-lenses 417 may be formed over the optical filter, as shown in FIG. 4C. Optical filter 415 may selectively pass red, green and blue light components onto corresponding photodiodes in sensor array region 407a, so that color pixel elements can be formed.

Example 1

1. Etching Solution Preparation

A P-type silicon substrate is provided. The silicon substrate has a resistivity in the range of 0.006 to 0.01 $\Omega \cdot cm$ and is doped with a doping concentration higher than $1 \times 10^{18}$ atoms/$cm^3$. The silicon substrate is then submitted to marking, cleaning, back-grinding, flipping, chemical mechanical polishing, and the like. An HNA solution is sprayed onto the silicon substrate and evenly distributed on the surface of the silicon substrate through a low rotation speed (<500 rpm) at a temperature of 25±5° C. and a spinning time of 60 minutes. The HNA solution includes HF, $HNO_3$, and $CH_3COOH$ in a volume ratio of 1:3:8, the mass concentration percentage of HF is 49%, the mass concentration percentage of $HNO_3$ is 70%, and the mass concentration percentage of $CH_3COOH$ is 100%.

During the rotation, the proportion of $HNO_2$ in the HNA solution gradually increases. The etching process stops when the etch rate reaches a stable value, and an etching solution is obtained from the HNA solution. A process for determining the etch rate can include measuring the thicknesses H1, H2, . . . , Hn of the P-type silicon substrate at the corresponding measuring time intervals t1, t2, . . . , tn, the etch rates can be calculated according to expressions (H1-H2)/t1, . . . , (Hn−1−Hn)/tn. The obtained etch rates is denoted S1 and is listed in Table 1 below.

2. Testing the Etch Rate of the Etching Solution

The etch rates of the etching solution are measured using the same P-type silicon substrates. The P-type silicon substrates are prepared the same way and have the same resistivity and doping concentration properties. The etch rates are determined the same way as described above and denoted S2, which are listed in Table 1 below.

Table 1 shows values of the etch rates according to Example 1.

TABLE 1

|  | Time interval | | | | | | |
| --- | --- | --- | --- | --- | --- | --- | --- |
|  | 0-10 minutes | 10-20 minutes | 20-30 minutes | 30-40 minutes | 40-50 minutes | 50-60 minutes | 60-70 minutes |
| S1 | 0 um/min | 0 um/min | 0 um/min | 2 um/min | 4 um/min | 7 um/min | 7 um/min |
| S2 | 7.01 um/min | 7.01 um/min | 6.99 um/min | 7.00 um/min | 7.00 um/min | 7.00 um/min | 7.00 um/min |

As can be seen from Table 1, in the preparation of the etching solution, the etch rate of the initial contact of the silicon substrate with the HNA solution is 0. The silicon substrate requires a predetermined reaction time with the HNA solution to affect etching. After a predetermined etching time, the etch rate remains stable, which means that the concentration of nitrite ions in the HNA solution reaches a saturation state, and the desired etching solution is obtained.

The etch rates S2 show that, using an etching solution containing saturated concentration of nitrite ions, the etch rates remain constant throughout the etching process, even in the early stages due to the presence of nitrite ions, the etch rates remain stable at about 7 um/minute.

3. Etching the BSI Image Sensing substrate

The thus processed silicon substrate is then washed with deionized water to obtain a to be etched BSI image sensing substrate. The resistivity of the image sensing substrate is in the range of about 0.0006 to about 0.01 Ω·cm and, and the resistivity of the epitaxial layer is about 1.0 Ω·cm. After washing, the thickness of the to be etched BSI image sensing substrate is then measured at 9 selected points to obtain the minimum value ("Min"), the maximum value ("Max"), the average value ("Ave'), the standard deviation ("StDev"), and the total difference in thicknesses ("TTV") of the silicon substrate. It is understood that the number of measuring points can be any integer number. In the example used, nine points are selected. But it is understood that the number is arbitrarily chosen for describing the example embodiment and should not be limiting.

The to be etched BSI image sensing substrate is put into an etching container and etched by spraying the above-described etching solution onto the surface of the to be etched BSI mage sensing substrate using a spray nozzle, The etching solution is evenly distributed on the surface by rotating the substrate. The etching process stops when the etching solution reaches the exposed surface of the epitaxial layer. The difference of thicknesses before and after etching are then determined. Table 2 shows data of the maximum, minimum, average, standard deviation and the total differences in thicknesses of the measurements.

TABLE 2

| Sample # | value before etching (in um) | | | | Value after etching (in um) | | | |
| --- | --- | --- | --- | --- | --- | --- | --- | --- |
|  | 1 | 2 | 3 | 4 | 1 | 2 | 3 | 4 |
| Max | 7.01 | 7.21 | 6.85 | 7.01 | 3.73 | 3.62 | 3.62 | 3.57 |
| Min | 6.26 | 6.15 | 6.15 | 6.23 | 3.53 | 3.46 | 3.45 | 3.40 |
| Ave | 6.74 | 6.78 | 6.57 | 6.82 | 3.62 | 3.52 | 3.55 | 3.48 |
| StDev | 0.20 | 0.30 | 0.15 | 0.23 | 0.03 | 0.04 | 0.04 | 0.05 |
| TTV | 0.75 | 1.06 | 0.70 | 0.78 | 0.20 | 0.16 | 0.17 | 0.17 |

As can be seen from Table 2, the total difference in thicknesses (TTV) of the silicon substrate before etching is very large, ranging between 0.70 um and 1.06 um. It shows that the thickness of the substrate is highly non-uniform before etching. After a selective etching of the substrate, the TTV is less than 0.2 um. In other words, regardless how uneven the thickness of the substrate before etching is, the total difference in thicknesses of the silicon substrate can be controlled within 0.2 um after etching according to the embodiment of the present invention.

Example 2

1. Etching Solution Preparation

A P-type silicon substrate is provided. The silicon substrate has a resistivity in the range of 0.01 to 0.02 Ω·cm and is doped with a doping concentration higher than $1\times10^{17}$ atoms/cm$^3$. The silicon substrate is then submitted to marking, cleaning, back-grinding, flipping, chemical mechanical polishing, and the like. An HNA solution is sprayed onto the silicon substrate and evenly distributed on the surface of the silicon substrate through a low rotation speed (<500 rpm) at a temperature of 25±5° C. and a spinning time of 60 minutes. The HNA solution includes HF, $HNO_3$, and $CH_3COOH$ in a volume ratio of 5:1:4, the mass concentration percentage of HF is 49%, the mass concentration percentage of $HNO_3$ is 70%, and the mass concentration percentage of $CH_3COOH$ is 100%. The etch rate can be determined using the same processes as described in Example 1 above and are denoted S3.

2. Testing the Etch Rate of the Etching Solution

The etch rates of the etching solution are measured using the same P-type silicon substrates. The P-type silicon substrates are prepared the same way and have the same resistivity and doping concentration properties. The etch rates are determined the same way as described the sections above and are denoted S4, which are listed in Table 3 below.

Table 3 shows values of the etch rates according to Example 2.

TABLE 3

| | \multicolumn{7}{c|}{Time interval} |
|---|---|---|---|---|---|---|---|
| | 0-10 minutes | 10-20 minutes | 20-30 minutes | 30-40 minutes | 40-50 minutes | 50-60 minutes | 60-70 minutes |
| S3 | 0 um/min | 0 um/min | 0 um/min | 1 um/min | 2 um/min | 3 um/min | 3 um/min |
| S4 | 2.99 um/min | 3.01 um/min | 3.00 um/min | 3.00 um/min | 2.99 um/min | 3.01 um/min | 3.00 um/min |

As can be seen from Table 3, in the preparation of the etching solution, the etch rate of the initial contact of the silicon substrate with the HNA solution is 0. The silicon substrate requires a predetermined reaction time with the HNA solution to affect etching. After the predetermined etching time, the etch rate remains stable, which means that the concentration of nitrite ions in the HNA solution reaches a saturation point, and the desired etching solution is obtained.

The etch rates S4 show that, using an etching solution containing saturated concentration of nitrite ions, the etch rates remain constant throughout the etching process, even in the early stages due to the presence of nitrite ions, the etch rates remain stable at about 3.0 um/minute.

3. Etching the BSI Image Sensing substrate

The thus processed silicon substrate is then washed with deionized water to obtain a to be etched BSI image sensing substrate. The resistivity of the image sensing substrate is in the range of about 0.01 to about 0.02 Ω·cm and, and the resistivity of the epitaxial layer is about 1.0 Ω·cm. After washing, the thickness of the to be etched BSI image sensing substrate is then measured at 10 selected points to obtain the minimum value ("Min"), the maximum value ("Max"), the average value ("Ave'), the standard deviation ("StDev"), and the total difference in thicknesses ("TTV") of the silicon substrate.

The to be etched BSI image sensing substrate is put into an etching container and etched by spraying the above-described etching solution onto the surface of the to be etched BSI mage sensing substrate using a spray nozzle, The etching solution is evenly distributed on the surface by rotating the substrate. The etching process stops when the etching solution reaches the exposed surface of the epitaxial layer. The thickness difference (difference in thicknesses) before and after etching will be determined. The processes are similar to those described above in Example 1. Table 4 shows data of the maximum, minimum, average, standard deviation and the total differences in thicknesses of the measurements before etching. The values are given in um (microns). It is understood that the number of measuring points can be any integer number. In the example used, ten points are selected. But it is understood that the number is arbitrarily chosen for describing the example embodiment and should not be limiting.

TABLE 4

| Sample | 1 | 2 | 3 | 4 | 5 |
|---|---|---|---|---|---|
| Max | 7.42 | 7.54 | 7.07 | 7.16 | 7.41 |
| Min | 5.46 | 6.89 | 5.22 | 5.06 | 5.98 |
| Ave | 6.16 | 7.32 | 6.36 | 6.56 | 6.77 |
| StDev | 0.57 | 0.14 | 0.55 | 0.425 | 0.37 |
| TTV | 1.96 | 0.65 | 1.85 | 2.10 | 1.43 |

TABLE 4-continued

| Sample | 6 | 7 | 8 | 9 | 10 |
|---|---|---|---|---|---|
| Max | 7.48 | 7.43 | 7.85 | 7.29 | 7.85 |
| Min | 6.94 | 6.66 | 6.29 | 6.70 | 6.65 |
| Ave | 7.29 | 7.06 | 6.86 | 7.13 | 7.24 |
| StDev | 0.12 | 0.19 | 0.29 | 0.15 | 0.21 |
| TTV | 0.54 | 0.77 | 1.56 | 0.59 | 1.20 |

Table 5 shows data of the maximum, minimum, average, standard deviation and the total differences in thicknesses of the measurements after etching. The values are given in um (microns).

TABLE 5

| Sample | 1 | 2 | 3 | 4 | 5 |
|---|---|---|---|---|---|
| Max | 3.53 | 3.45 | 3.52 | 3.48 | 3.51 |
| Min | 3.42 | 3.41 | 3.42 | 3.41 | 3.43 |
| Ave | 3.47 | 3.43 | 3.46 | 3.45 | 3.46 |
| StDev | 0.04 | 0.01 | 0.04 | 0.03 | 0.03 |
| TTV | 0.11 | 004 | 0.10 | 0.07 | 0.08 |
| Sample | 6 | 7 | 8 | 9 | 10 |
| Max | 3.45 | 3.45 | 3.45 | 3.45 | 3.46 |
| Min | 3.25 | 3.24 | 3.24 | 3.27 | 3.38 |
| Ave | 3.38 | 3.39 | 3.40 | 3.40 | 3.43 |
| StDev | 0.09 | 0.08 | 0.07 | 0.07 | 0.03 |
| TTV | 0.20 | 0.21 | 0.21 | 0.18 | 0.08 |

As can be seen from Tables 4 and 5, the total difference in thicknesses (TTV) of the silicon substrate before etching is very large, ranging between 0.54 and 2.10 um. It shows that the thickness of the substrate is highly non-uniform before etching. After a selective etching of the substrate, the TTV is less than 0.21 um. In other words, regardless how uneven the thickness of the substrate before etching is, the total difference in thicknesses of the silicon substrate can be controlled within 0.21 um after etching according to the embodiment of the present invention Example 3

1. Etching Solution Preparation

An N-type silicon substrate is provided. The N-type silicon substrate has a resistivity in the range of 0.05 to 0.08 Ω·cm and is doped with a doping concentration higher than $1\times10^{16}$ atoms/cm$^3$. The N-type silicon substrate is then submitted to marking, cleaning, back-grinding, flipping, chemical mechanical polishing, and the like. An HNA solution is sprayed onto the silicon substrate and evenly distributed on the surface of the silicon substrate through a low rotation speed (<500 rpm) at a temperature of 25±5° C. and a spinning time of 80 minutes. The HNA solution includes HF, $HNO_3$, and $CH_3COOH$ in a volume ratio of 3:5:2, the mass concentration percentage of HF is 30%, the mass concentration percentage of $HNO_3$ is 60%, and the mass concentration percentage of $CH_3COOH$ is 80%. The etch rate can be determined using the same processes as described in Example 1 above and are denoted S5.

2. Testing the Etch Rate of the Etching Solution

The etch rates of the etching solution are measured using same N-type silicon substrates. The N-type silicon substrates are prepared the same way and have the same resistivity and doping concentration properties. The etch rates are determined the same way as described in sections above in Example 1 and are denoted S6, which are listed in Table 6 below.

Table 6 shows values of the etch rates according to Example 3.

TABLE 6

|    | Time interval | | | | | | |
| --- | --- | --- | --- | --- | --- | --- | --- |
|    | 0-10 minutes | 10-20 minutes | 20-30 minutes | 30-40 minutes | 40-50 minutes | 50-60 minutes | 60-70 minutes |
| S5 | 0 um/min | 0 um/min | 0 um/min | 0.1 um/min | 0.3 um/min | 0.5 um/min | 0.5 um/min |
| S6 | 0.5 um/min | 0.49 um/min | 0.49 um/min | 0.49 um/min | 0.5 um/min | 0.51 um/min | 0.51 um/min |

As can be seen from Table 6, in the preparation of the etching solution, the etch rate of the initial contact of the silicon substrate with the HNA solution is 0. The silicon substrate requires a predetermined reaction time with the HNA solution to affect etching. After the predetermined etching time, the etch rate remains stable, which means that the concentration of nitrite ions in the HNA solution reaches a saturation point, and the desired etching solution is obtained.

The etch rates S6 show that, using an etching solution containing saturated concentration of nitrite ions, the etch rates remain constant throughout the etching process, even in the early stages due to the presence of nitrite ions, the etch rates remain stable at about 0.5 um/minute.

3. Etching the BSI Image Sensing substrate

Five silicon substrates are processed similar as described in Example 1 above, i.e., they are washed with deionized water to obtain the to be etched BSI image sensing substrates. The resistivity of the image sensing substrates is in the range of about 0.05 to about 0.08 Ω·cm, and the resistivity of the epitaxial layer is about 1.0 Ω·cm. The substrates are then submitted to the etching process that stops when the etching solution reaches the exposed surface of the epitaxial layer. The total difference in thicknesses (TTV) of the silicon substrate before etching is very large, ranging between 0.60 and 1.95 um. It shows that the thickness of the substrate is highly non-uniform before etching. After a selective etching of the substrate, the TTV is less than 0.20 um according to the embodiment of the present invention.

Example 4

1. Etching Solution Preparation

An N-type silicon substrate is provided. The N-type silicon substrate has a resistivity in the range of 0.001 to 0.002 Ω·cm and is doped with a doping concentration higher than $1 \times 10^{19}$ atoms/$cm^3$. The N-type silicon substrate is then submitted to marking, cleaning, back-grinding, flipping, chemical mechanical polishing, and the like. An HNA solution is sprayed onto the N-type silicon substrate and evenly distributed on the surface of the silicon substrate through a low rotation speed (<500 rpm) at a temperature of 25±5° C. and a spinning time of 80 minutes. The HNA solution includes HF, $HNO_3$, and $CH_3COOH$ in a volume ratio of 1:5:15, the mass concentration percentage of HF is 40%, the mass concentration percentage of $HNO_3$ is 50%, and the mass concentration percentage of $CH_3COOH$ is 99.5%. The etch rates can be determined using the same processes as described in Example 1 above, and the final obtained etch rate is 2 um/minute.

2. Testing the Etch Rate of the Etching Solution

The etch rates are determined the same way as described in sections above in Example 1 and maintain relatively constant even at the beginning of the etching process due to the presence of the nitrite ions. The etch rate is about 2.0 um/minute.

3. Etching the BSI Image Sensing substrate

Five silicon substrates are processed similar as described in Example 1 above, i.e., they are washed with deionized water to obtain the to be etched BSI image sensing substrates. The resistivity of the image sensing substrates is in the range of about 0.001 to about 0.002 Ω·cm, and the resistivity of the epitaxial layer is about 1.0 Ω·cm. The substrates are then submitted to the etching process that stops when the etching solution reaches the exposed surface of the epitaxial layer. The total difference in thicknesses (TTV) of the silicon substrate before etching is very large, ranging between 0.82 um and 2.38 um. It shows that the thickness of the substrate is highly non-uniform before etching. After a selective etching of the substrate, the TTV is less than 0.21 um according to the embodiment of the present invention.

Various embodiments of the present invention provide methods of manufacturing a BSI image sensing device. Technical effects of the various embodiments provide a way of obtaining an etching solution that is more suitable for wet etching of wafers or substrates with relatively low resistivity. For example, embodiments described the pretreatment of an HNA solution to obtain an etching solution having a saturated concentration of nitrite ions. The use of this etching solution for wet etching not only enables a selective etching of a substrate having a relatively low resistivity but also avoids the step of a chemical mechanical polishing process. Due to the saturated concentration of nitride ions in the HNA solution, the etch rate remains relatively constant during the etching process. The etched substrate has a uniform thickness, and the total thickness difference can be controlled within a range of about 0.2 um. The etching process of the present invention provides a relatively high quantum efficiency of the image sensor and sharp image. Incident light uniformly reaches the light sensing regions of the BSI image sensor thanks to the uniform thickness of the substrate according to the present invention. In contrast, due to the uneven thickness of a BSI image sensor produced with conventional etching techniques, the photoelectric effect of conventional BSI image sensor will be affected.

The preferred embodiments of the present invention have been described for illustrative modification purposes, and those skilled in the art will appreciate that various modifications, additions and substitutions are possible, without departing from the scope and spirit of the invention as disclosed in the claims.

This disclosure uses examples to describe the invention to enable those of skill in the art to practice the invention including performing any methods thereof. The invention has broader applications than the production of BSI sensor devices. It is the following claims including all equivalents that define the scope of the present invention.

What is claimed is:

1. A method of selectively etching a semiconductor device, the method comprising:
    providing an etching solution having a first nitrite ion concentration $C0$;
    etching a doped silicon substrate with the etching solution for a predetermined time duration to increase the first nitrite ion concentration $C0$ to a second nitrite ion concentration $C1$;
    etching the semiconductor device using the etching solution having the second nitrite ion concentration $C1$;
    wherein the etching solution is an HNA solution comprises a hydrofluoric acid (HF), a nitric acid (HNO3), and a acetic acid (CH3COOH).

2. The method of claim 1, wherein $C1$ is higher than 5 times $C0$.

3. The method of claim 2, wherein $C1$ is a saturated concentration of nitrite ions.

4. The method of claim 1, wherein the doped silicon substrate has a resistivity less than $10^{-1}$ Ω·cm.

5. The method of claim 4, wherein the resistivity is in a range between $10^{-3}$ Ω·cm and $10^{-2}$ Ω·cm.

6. The method of claim 1, wherein the doped silicon substrate comprises arsenic, antimony, phosphorous, or boron.

7. The method of claim 1, wherein the doped silicon substrate is an N-type silicon substrate.

8. The method of claim 7, wherein the N-type silicon substrate has a doping concentration greater than $1 \times 10^{18}$ atoms/cm$^3$.

9. The method of claim 1, wherein the doped silicon substrate is a P-type silicon substrate.

10. The method of claim 9, wherein the P-type silicon substrate has a doping concentration greater than $1 \times 10^{18}$ atoms/cm$^3$ and a resistivity in a range between 0.006 Ω·cm and 0.01 Ω·cm.

11. The method of claim 1, wherein the predetermined time duration is in a range between 55 minutes and 65 minutes.

12. The method of claim 11, wherein the predetermined time duration is 60 minutes.

13. The method of claim 1, wherein HNA solution comprises the HNA solution has a volume ratio of HF:HNO3:CH3COOH in a range of 1-5:1-5:2-10.

14. The method of claim 13, wherein the volume ratio of HF:HNO3:CH3COOH is 1:3:8.

15. The method of claim 1, wherein etching the doped silicon substrate with the HNA solution comprises:
    spraying the HNA solution onto a surface of the doped silicon substrate;
    rotating the sprayed doped silicon substrate at a room temperature; and
    etching the semiconductor device comprises:
    spraying the etching solution onto a portion of the semiconductor device; and
    rotating the semiconductor device at the room temperature.

16. A method of manufacturing a backside illuminated (BSI) image sensor device, the method comprising:
    providing an HNA solution comprising a hydrofluoric acid (HF), a nitric acid (HNO3), and a acetic acid (CH3COOH) and having a first nitrite ion concentration;
    increasing the first nitrite ion concentration to a second nitrite ion concentration by etching a doped silicon substrate with the HNA solution for a predetermined time duration;
    providing a substrate having a first surface and a second surface opposite the first surface;
    forming an epitaxial layer on the first surface, the epitaxial layer having a resistivity $R1$ larger than a resistivity $R2$ of the substrate;
    selectively etching the second surface of the substrate to expose a lower surface of the epitaxial layer using the HNA solution having the second nitrite ion concentration; and
    sequentially forming an optical film on the exposed lower surface of the epitaxial layer and a plurality of microlenses on the optical film.

17. The method of claim 16, wherein $R1$ is larger than $10^{-1}$ Ω·cm, and $R2$ is less than $10^{-1}$ Ω·cm.

18. The method of claim 17, wherein $R1$ is larger than 10 times $R2$.

19. The method of claim 18, wherein $R1$ is larger than 100 times $R2$.

20. The method of claim 16, further comprising, after forming the epitaxial layer and before selectively etching the second surface of the substrate:
    forming a light sensing region in the epitaxial layer; and
    sequentially forming a pixel region, an interconnection structure, and a passivation layer on the epitaxial layer.

* * * * *